(12) United States Patent
Kadowaki

(10) Patent No.: US 6,480,042 B2
(45) Date of Patent: Nov. 12, 2002

(54) CURRENT-TO-VOLTAGE CONVERTING CIRCUIT, OPTICAL PICKUP HEAD APPARATUS, AND APPARATUS AND METHOD FOR RECORDING/ REPRODUCING DATA

(75) Inventor: Shin-ichi Kadowaki, Sanda (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/897,466

(22) Filed: Jul. 3, 2001

(65) Prior Publication Data

US 2002/0011878 A1 Jan. 31, 2002

(30) Foreign Application Priority Data

Jul. 4, 2000 (JP) .......................................... 2000-202213

(51) Int. Cl.$^7$ ............................................. H02M 11/00
(52) U.S. Cl. ..................................................... 327/103
(58) Field of Search ................................. 327/103, 530, 327/534, 535, 538, 543

(56) References Cited

U.S. PATENT DOCUMENTS

| 5,514,989 | A | | 5/1996 | Sato et al. ................... 327/109 |
| 5,625,181 | A | | 4/1997 | Yasuda et al. ........... 250/214 A |
| 5,886,546 | A | * | 3/1999 | Hwang ........................ 327/103 |
| 5,981,936 | A | | 11/1999 | Fujiie ..................... 250/214 A |
| 6,114,740 | A | | 9/2000 | Takimoto et al. ............ 257/461 |
| 6,194,919 | B1 | * | 2/2001 | Park ............................ 327/52 |

FOREIGN PATENT DOCUMENTS

| JP | 5-13742 | 1/1993 |
| JP | 6-196746 | 7/1994 |
| JP | 7-245540 | 9/1995 |
| JP | 9-260961 | 10/1997 |
| JP | 10-107243 | 4/1998 |
| JP | 10-223922 | 8/1998 |
| JP | 10-256841 | 9/1998 |
| JP | 11-296892 | 10/1999 |
| JP | 11-312823 | 11/1999 |

* cited by examiner

*Primary Examiner*—Jeffrey Zweizig
(74) *Attorney, Agent, or Firm*—Wenderoth, Lind & Ponack, L.L.P.

(57) ABSTRACT

The invention provides a current-to-voltage converting circuit and an optical pickup head apparatus using the same. The current-to-voltage converting circuit converts, to a voltage signal, a current signal received from a photodetector which receives a light reflected on the recording medium such as an optical disk and provides a current signal corresponding to amount of the received light, for reproduction of data. The current-to-voltage converting circuit comprises a differential amplifier comprising transistors Q1 and Q2 applied with a negative feedback, current sources I1 and I2 for supplying the differential amplifier with two kinds of idling currents, and switches SW1 and SW2 for selecting current source I1 or I2 to determine the idling current to be supplied to the differential amplifier according to a level of the current signal received from the photodetector or a reflectance of the recording medium.

21 Claims, 13 Drawing Sheets ized as digital audio disks, video disks, text file disks, and data file disks. In particular, digital versatile discs (DVDs) which are recently popularized are optical high-density recordable disks which use a visible light with 650 nm wavelength from a semiconductor laser of a light source. A variety of recording media such as DVD-ROM for read-only operation, DVD-R capable of recording only one time, and DVD-RAM capable of recording a plurality of times are standardized.

CURRENT-TO-VOLTAGE CONVERTING CIRCUIT, OPTICAL PICKUP HEAD APPARATUS, AND APPARATUS AND METHOD FOR RECORDING/REPRODUCING DATA

BACKGROUND OF THE INVENTION

1. Field of the Invention

The present invention relates to a current-to-voltage converting circuit, an optical pickup head apparatus, an apparatus and a method for recording, reproducing or erasing data on an optical disk.

2. Description of the Related Art

Optical memory technologies for recording a large volume of information data on optical disks, each disk having a pattern of pits and used as a high-density, mass-storage recording medium, have now been marketed worldwide in the form of digital audio disks, video disks, text file disks, and data file disks. In particular, digital versatile discs (DVDs) which are recently popularized are optical high-density recordable disks which use a visible light with 650 nm wavelength from a semiconductor laser of a light source. A variety of recording media such as DVD-ROM for read-only operation, DVD-R capable of recording only one time, and DVD-RAM capable of recording a plurality of times are standardized.

FIG. 12 is a schematic view of an optical system of a conventional optical pickup head apparatus for reading data from a DVD-ROM disk as a recording medium. A semiconductor laser 1 emits divergent beam 70 which is linearly polarized and has a wavelength λ1=650 nm. The beam 70 is reflected on a half-mirror 7 and changed with a path of the beam 70. Subsequently, the beam 70 passes through a collimate lens 8 having 20 mm of a focusing distance, and is collimated to a parallel beam. The beam 70 is then converged by an object lens 9 having 3 mm of a focusing distance, is passed through a transparent substrate 40a of a recording medium 40, and focused on a data recording surface 40b. The aperture of the object lens 9 is limited by an aperture 12, where a numeral aperture (NA) is set to 0.6. The thickness of the transparent substrate 40a is 0.6 mm. The beam 70 reflected on the data recording surface 40b passes through the object lens 9, and the collimate lens 8. Then the beam 70 passes through the half-mirror 7 to be added with an astigmatism, passes through a concave lens 11 of which optical axis is inclined to correct a comma added at the passage through the half-mirror 7, and received by a photo detector 31. An axis 31e is an axis parallel with an image of a track provided on the data recording surface 40b of the recording medium 40 in the beam 70 received on the photo detector 31.

The photodetector 31 has four photo receivers 31a to 31d for outputting current signals I31a to I31d according to amount of received light, respectively. Size of each of photo receivers 31a to 31d is 50 μm×50 μm. The current signals I31a to I31d are fed into corresponding circuits 50a to 50d of a current-to-voltage converting circuit 50 to be converted into voltage signals V50a to V50d, respectively. The voltage signals V50a to V50d are then released from the optical pickup head apparatus.

A focusing error signal is calculated from the output signals V50a to V50d of the optical pickup head apparatus by an astigmatic method, that is, by a calculation of (V50a+V50c)−(V50b+V50d). A tracking error signal is calculated by a phase difference method of comparing the phases of the signals V50a to V50d when the recording medium is a DVD-ROM or by a push-pull method when the recording medium is a DVD-RAM, that is, by a calculation of (V50a+V50d)−(V50b+V50c). The focusing error signal and the tracking error signal are then amplified to a desired level, and phase-compensated. Subsequently the signals are transferred to actuators 91 and 92 for focusing and tracking control.

FIG. 13 is a diagram of the circuit 50a in the current-to-voltage converting circuit 50. As the four circuits 50a to 50d are identical in construction, the action of the circuit 50a will representatively be described.

The current signal I31a from the photo receiver 31a is received by a terminal P1. The received signal is then converted to a voltage signal by a differential amplifier composed of a pair of transistors Q1 and Q2. A pair of transistors Q4 and Q5 act as a load of the differential amplifier. A voltage at the collector of the transistor Q1 is fed back via a transistor Q7 and a resistor Rf to the base of the transistor Q1. Degree of the conversion of the current signal to the voltage signal in the circuit 50a does not depend on the amplifying factor of each transistor but is determined by the resistor Rf. The voltage signal converted from the current signal is then released as a reference voltage Vc from a terminal P2. A capacitor Cf is used for attenuating poles generated by a parasitic capacitance in the resistor Rf and so on. The base of the transistor Q2 is connected with the reference voltage Vc of the circuit. A voltage between Vcc and GND is 5 V, and a voltage between Vc and GND is 2.5 V. The idling current Ic0 supplied from a current source I0 to the differential amplifier is 1500 μA (The idling current is a collector current which flows the transistor when no signal is input).

Commonly for reproducing data, a DVD-ROM is rotated at 3.49 m/s of linear velocity and a 4.7 GB DVD-RAM is rotated at 8.2 m/s of linear velocity. In a data reproducing apparatuses using DVD-ROM, a technology for rapidly reading data has been developed, and the apparatus are commercialized which can read data substantially 10 or more times faster than an initial products having linear velocity of 3.49 m/s. However, when DVD-RAM is reproduced in such an apparatuses which can reproduce the data faster, there is a problem that the data may not be read accurately since signal-to-noise ratio of the DVD-RAM is lower than that of DVD-ROM. That is, as there is a difference in the optical properties between DVD-ROM and DVD-RAM, it is hard to realize stable reading operation to both types of the recording media.

SUMMARY OF THE INVENTION

It is thus an object of the present invention, for eliminating the foregoing drawback and realizing both of the rapid reproduction of DVD-ROM and the stable reproduction of DVD-RAM. The object also is to provide a current-to-voltage converting circuit which is simple in construction and can produce less noises, and an optical pickup head apparatus using such a current-to-voltage converting circuit. It is another object of the present invention to provide an apparatus for recording or reproducing data using the optical pickup head apparatus, and a method of recording or reproducing data implemented with the current-to-voltage converting circuit.

In a first aspect of the invention, a current-to-voltage converting circuit is provided which receives a current signal output from a photodetector outputting a current signal according to amount of received light and converts the received current signal into a voltage signal. The circuit comprises an active element applied with a negative feedback, and a variable current section for varying an idling current which is to be supplied to the active element in accordance with a level of the current signal received from the photodetector or a reproduction speed of the data.

In a second aspect of the invention, a current-to-voltage converting circuit is provided which comprises a current-to-voltage converter which receives a current signal output from a photodetector outputting a current signal according to amount of received light and converts the received current signal into a voltage signal, the current-to-voltage converter comprising an active element applied with a negative feedback, a dummy circuit which has the same structure as the current-to-voltage converter and receives no current signal from the photodetector, a differential operator for performing a differential operation between a signal output from the dummy circuit and a reference signal, a operating section for performing a differential operation or an adding operation, using the voltage signal from the current-to-voltage converter and a signal output from the differential operator, and a current variable section for varying an idling current which is to be supplied to the active element in accordance with a level of the current signal received from the photodetector or a reproduction speed of the data.

In a third aspect of the invention, a current-to-voltage converting circuit is provided which receives a current signal output from a photodetector outputting a current signal according to amount of received light and converts the received current signal into a voltage signal. The circuit comprises a current-to-voltage converter for converting the current signal into the voltage signal, and a variable current section for varying an idling current which is to be supplied to the current-to-voltage converter in accordance with a level of the current signal received from the photodetector or a reproduction speed of the data. In the circuit, a gain to convert a current into a voltage is provided by a negative feedback in which a signal output from the current-to-voltage converter is negatively fed back into an input of the current-to-voltage converter.

In a fourth aspect of the invention, a current-to-voltage converting circuit is provided which receives a current signal output from a photodetector outputting a current signal according to amount of received light and converts the received current signal into a voltage signal. The circuit comprises a current-to-voltage converter for converting the current signal into the voltage signal, an amplifier for receiving the voltage signal from the current-to-voltage converter and amplifying the received voltage signal, and a current variable section for varying an idling current which is to be supplied to the current-to-voltage converter in accordance with a level of the current signal received from the photodetector or a reproduction speed of the data. In the circuit, a gain to convert a current into a voltage is provided by a negative feedback in which a signal output from the amplifier is negatively fed back to the current-to-voltage converter.

In a fifth aspect of the invention, an optical pickup head apparatus is provided which comprises a light source for emitting a laser beam, a light focusing section for focusing the beam which is received from the light source on a recording medium, a beam splitter for splitting the beam which is reflected on the recording medium, a photodetector for receiving the split beam from the beam splitter and releasing a current signal which corresponds to amount of the received beam, and the above current-to-voltage converting circuit for converting the current signal received from the photodetector into a voltage signal.

In a sixth aspect of the invention, an apparatus for recording or reproducing data is provided which comprises the above optical pickup head apparatus, a drive for varying the relative position of the optical pickup head apparatus to a recording medium, and a signal processor for applying a predetermined operation to a signal received from the optical pickup head apparatus to provide a desired data.

In a seventh aspect of the invention, provided is a method of reproducing data from a recording medium by using a current-to-voltage converting circuit for converting a current signal from a photodetector to a voltage signal, the photodetector providing the current signal corresponding to amount of the light reflected on the recording medium, the current-to-voltage converting circuit including an active element applied with a negative feedback and being operable to vary an idling current to be supplied to the active element. The current signal provided from the photodetector has two different levels including a first level and a second level which is smaller than the first level, the idling current to be supplied to the active element has two different currents including a first current (Ic1) and a second current (Ic2) which is smaller than the first current (Ic1). The method comprises detecting the level of the current signal provided from the photodetector, and setting the detected idling current to the first current (Ic1) when the current signal from the photodetector is at the first level, or setting the idling current to the second current (Ic2) when the current signal from the photodetector is at the second level.

In an eighth aspect of the invention, provided is a method of reproducing data from a recording medium by using a current-to-voltage converting circuit for converting a current signal from a photodetector to a voltage signal, the photodetector providing the current signal corresponding to amount of the light reflected on the recording medium, the current-to-voltage converting circuit including an active element applied with a negative feedback and being operable to vary an idling current to be supplied to the active element. The current signal provided from the photodetector is transferred at one of a first transfer rate and a second transfer rate which is slower than the first transfer rate, the idling current to be supplied to the active element has one of a first current (Ic1) and a second current (Ic2) which is smaller than the first current (Ic1). The method comprises detecting the transfer rate of the data, and setting the idling current to the first current (Ic1) when the current signal from the photodetector is transferred at the first transfer rate, or setting the idling current to the second current (Ic2) when the current signal from the photodetector is transferred at the second transfer rate.

According to the present invention, the idling current is selectively determined depending on the reflectance of the recording medium to minimize the generation of noises in the current-to-voltage converting circuit generated from the optical properties of the recording medium so that data read out from the recording medium can be reproduced at optimum conditions. Accordingly, it is possible to perform stably both of reading data at high speed from the recording medium such as DVD-ROM, and reading surely data with a low signal level from the recording medium such as DVD-RAM As a result, the data recording/reproducing apparatus will be improved in the operational reliability,

PREFERRED EMBODIMENTS OF THE INVENTION

Embodiments of the present invention in the form of a current-to-voltage converting circuit, an optical pickup head apparatus, and an apparatus for data recording or reproducing according to embodiments of the present invention will be described referring to the accompanying drawings. Throughout the drawings, like numerals denote like components or functions.

(First Embodiment)

Figure 1:
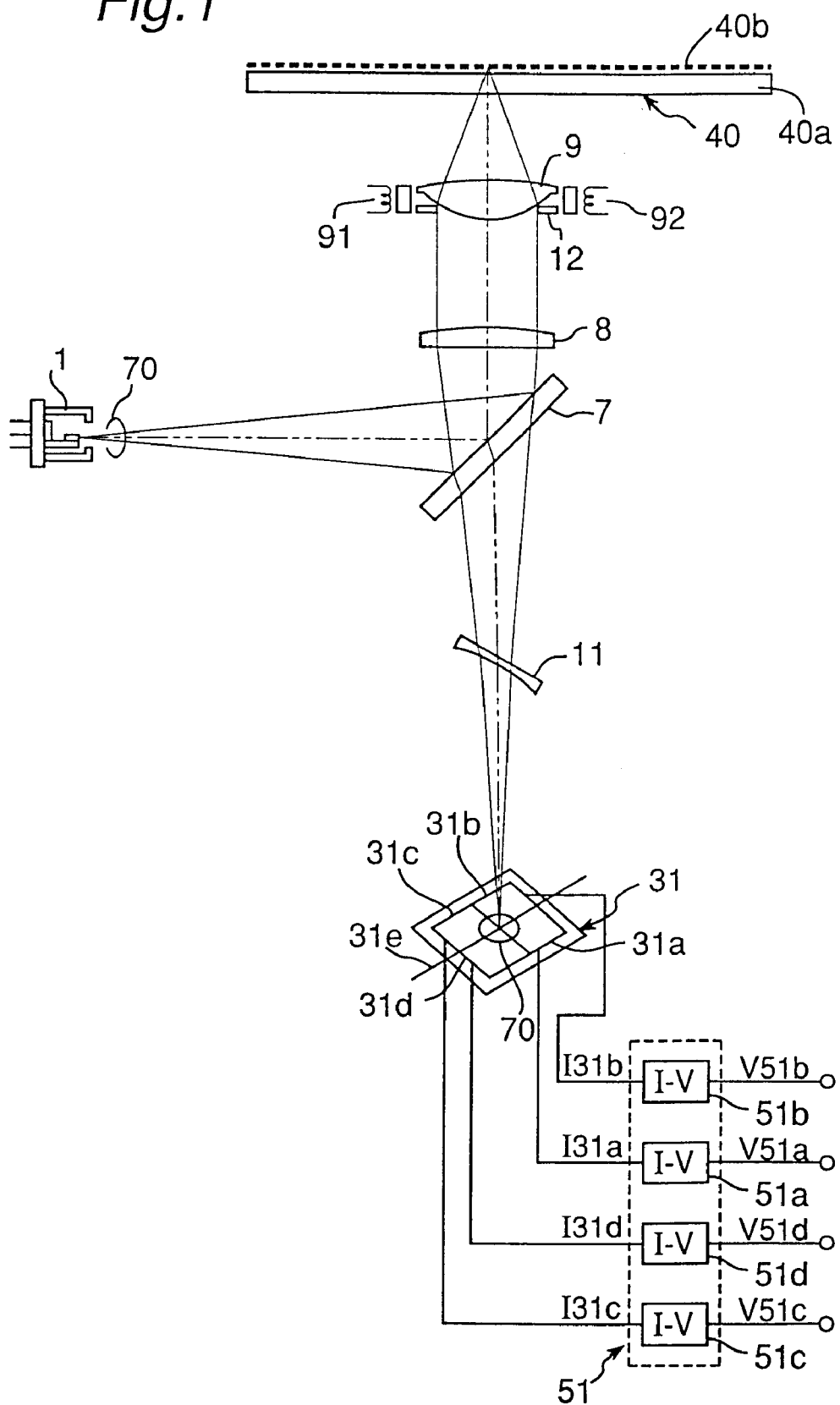
FIG. 1 is a schematic view of an optical pickup head apparatus showing the first embodiment of the present invention.

FIG. 1 is a schematic view of an arrangement of the optical pickup head apparatus according to the present invention. The optical pickup head apparatus is substantially similar in the arrangement to the conventional optical pickup head apparatus shown in FIG. 11, except for a novel current-to-voltage converting circuit 51 which is different from the prior current-to-voltage converting circuit 50 (see FIG. 11). A semiconductor laser 1 emits a divergent beam 70 which is linearly polarized and has a wavelength $\lambda 1 = 650$ nm. The beam 70 is reflected on a half-mirror 7 and changed with a path of the beam 70. Subsequently, the beam 70 passes through a collimate lens 8 having 20 mm of a focusing distance, and is collimated to a parallel beam. The beam 70 is then converged by an object lens 9 having 3 mm of a focusing distance, is passed through a transparent substrate 40a of a recording medium 40, and focused on a data recording surface 40b. The aperture of the object lens 9 is limited by an aperture 12, where a numeral aperture (NA) is set to 0.6. The thickness of the transparent substrate 40a is 0.6 mm. The beam 70 reflected on the data recording surface 40b passes through the object lens 9, and the collimate lens 8. Then the beam 70 passes through the half-mirror 7 to be added with an astigmatism, passes through a concave lens 11 of which optical axis is inclined to correct a comma added at the passage through the half-mirror 7, and received by a photo detector 31. An axis 3le is an axis parallel with an image of a track provided on the data recording surface 40b of the recording medium 40 in the beam 70 received on the photo detector 31.

The photodetector 31 has four photo receivers 31a to 31d for outputting current signals I31a to I31d according to amount of received light, respectively. Size of each of photo receivers 31a to 31d is 50 $\mu$m×50 $\mu$m. The current signals I31a to I31d are fed into corresponding circuits 50a to 50d of a current-to-voltage converting circuit 50 to be converted into voltage signals V50a to V50d, respectively. The voltage signals V50a to V50d are then released from the optical pickup head apparatus.

A focusing error signal is calculated from the output signals V51a to V51d of the optical pickup head apparatus by an astigmatic method, that is, by a calculation of (V51a+V51c)−(V51b+V51d). A tracking error signal is calculated by a phase difference method of comparing the phases of the signals V51a to V51d when the recording medium is a DVD-ROM or by a push-pull method when the recording medium is a DVD-RAM, that is, by a calculation of (V51a+V51d)−(V51b+V51c). The focusing error signal and the tracking error signal are then amplified to a desired level, and phase-compensated. Subsequently the signals are transferred to actuators 91 and 92 for focusing and tracking control.

Figure 2:
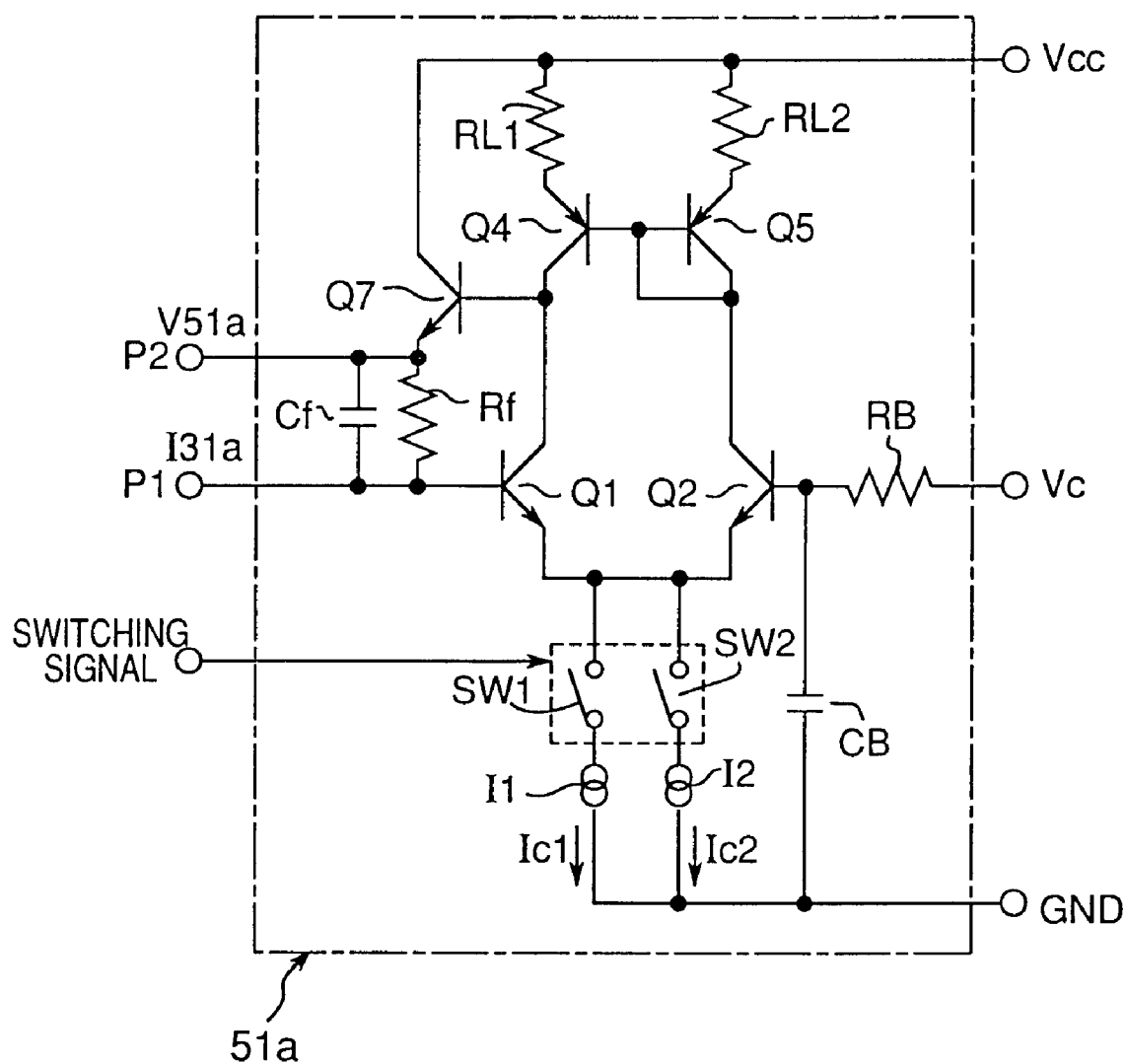
FIG. 2 is a diagram showing a current-to-voltage converting circuit in the optical pickup head apparatus of the first embodiment of the present invention.

FIG. 2 is a diagram of the circuit 51a in the current-to-voltage converting circuit 51 according to the present invention. As the four circuits 51a to 51d are identical in construction, the action of the circuit 51a will representatively be described.

The current signal I31a from the photo receiver 31a is received by a terminal P1. The received signal is then converted to a voltage signal by a differential amplifier composed of a pair of transistors Q1 and Q2 which are active elements. A pair of transistors Q4 and Q5 and resistor RL1 and RL2 act as a load of the differential amplifier. A voltage at the collector of the transistor Q1 is fed back via a transistor Q7 and a resistor Rf to the base of the transistor Q1. Degree of the conversion of the current signal to the voltage signal in the circuit 51a does not depend on the amplifying factor of each transistor but is determined by the resistor Rf.

The voltage signal V51a converted from the current signal is then released as a reference voltage Vc from a terminal P2. A capacitor Cf is used for attenuating poles generated by a parasitic capacitance in the resistor Rf and so on. The resistor RB connected to the base of the transistor Q2 is connected with the reference voltage Vc of the circuit, and used for suppressing offset generated by currents flowing through the bases of transistors Q1 and Q2.

A voltage between a power supply Vcc and a ground GND is 5 V, and a voltage between a reference voltage Vc and a ground GND is 2.5 V. A capacitor CB is used for maintaining the base voltage of the transistor Q2 to a constant level to stabilize the action of the circuit at a high frequency and for inhibiting thermal noises generated in the resistor RB from being released from the terminal P2. Also, the resistors RL1 and RL2 are set to several hundreds to several kilo-ohms for attenuating the noises across the terminal P2. More specifically, the resistors Rf, RL1, and RL2 in this embodiment are 40 kΩ, 500 kΩ, and 500 kΩ, respectively.

Switches SW1 and SW2 are provided for switching a connection of either of the current source I1 or I2 to the differential amplifier. More particularly, either of the switch SW1 or SW2 is closed according to the reflectance of the recording medium or the speed of reproduction. The switches are controlled as the following. When the recording medium having a high reflectance such as a DVD-ROM (of which reflectance is about 70%) is reproduced, the switch SW1 may be closed. When the recording medium having a low reflectance such as a DVD-RAM (of which the reflectance is about 15%), the switch SW2 may be closed. If the recording medium has two different speed for reproduction, the two switches SW1 and SW2 may be switched from one to another according to the reproduction speed. For example, the switch SW1 may be closed when the medium is reproduced at a higher speed, the switch SW2 may then be closed when the medium is reproduced at a lower speed. The two switches SW1 and SW2 is controlled by a switching signal generated according to the reproduction speed or the reflectance of the recording medium.

The switching signal can be obtained by using a fact that the intensity of a signal output from the photo detector is proportional to the reflectance and that transfer rate of the signal output from the photo detector is proportional to the reproduction speed.

Detection of the reflectance or the reproduction speed of the recording medium is a function incorporated in a DVD player or a DVD-RAM which have been already practically developed, and therefore the detail description thereof is omitted herein.

The idling currents Ic1 and Ic2 supplied from a couple of current sources I1 and I2 are 1500 $\mu$A and 150 $\mu$A, respectively.

The current-to-voltage converting circuit 51 of the present invention switches the idling current supplied to the differential amplifier which is a current-to-voltage converter according to the reflectance or the reproduction speed of the recording medium. Thus, it becomes possible to stably realize that the data recorded on the DVD-ROM can be quickly read, and further that the data recorded on the DVD-RAM with low signal level can be read surely. Accordingly, the operational reliability of an optical data processor using the current-to-voltage converting circuit of the present invention can be improved. The characteristic action of the current-to-voltage converting circuit will be explained later in more detail.

The current-to-voltage converting circuit of the present invention is small in the circuitry arrangement. The switches SW1 and SW2 just switch the source but does not influence the DC offset of the amplifier. Therefore a bipolar CMOS technique is not always needed, and the circuit can be fabricated at low cost by using a bipolar process.

Though the two switches SW1 and SW2 are schematically shown in FIG. 2, the switches may be implemented by a switching construction using general bipolar transistors in which, for example, the sources I1 and I2 comprise current mirror circuits and current sources to the current mirror circuits are controlled by switching action. To broaden a dynamic range of the output of the voltage-to-current circuit, the current sources to the current mirror circuits may preferably be controlled by switching action. The idling current may continuously be switched in n steps (n≧3, n is an integer) other than two steps.

(Second Embodiment)

Figure 3:
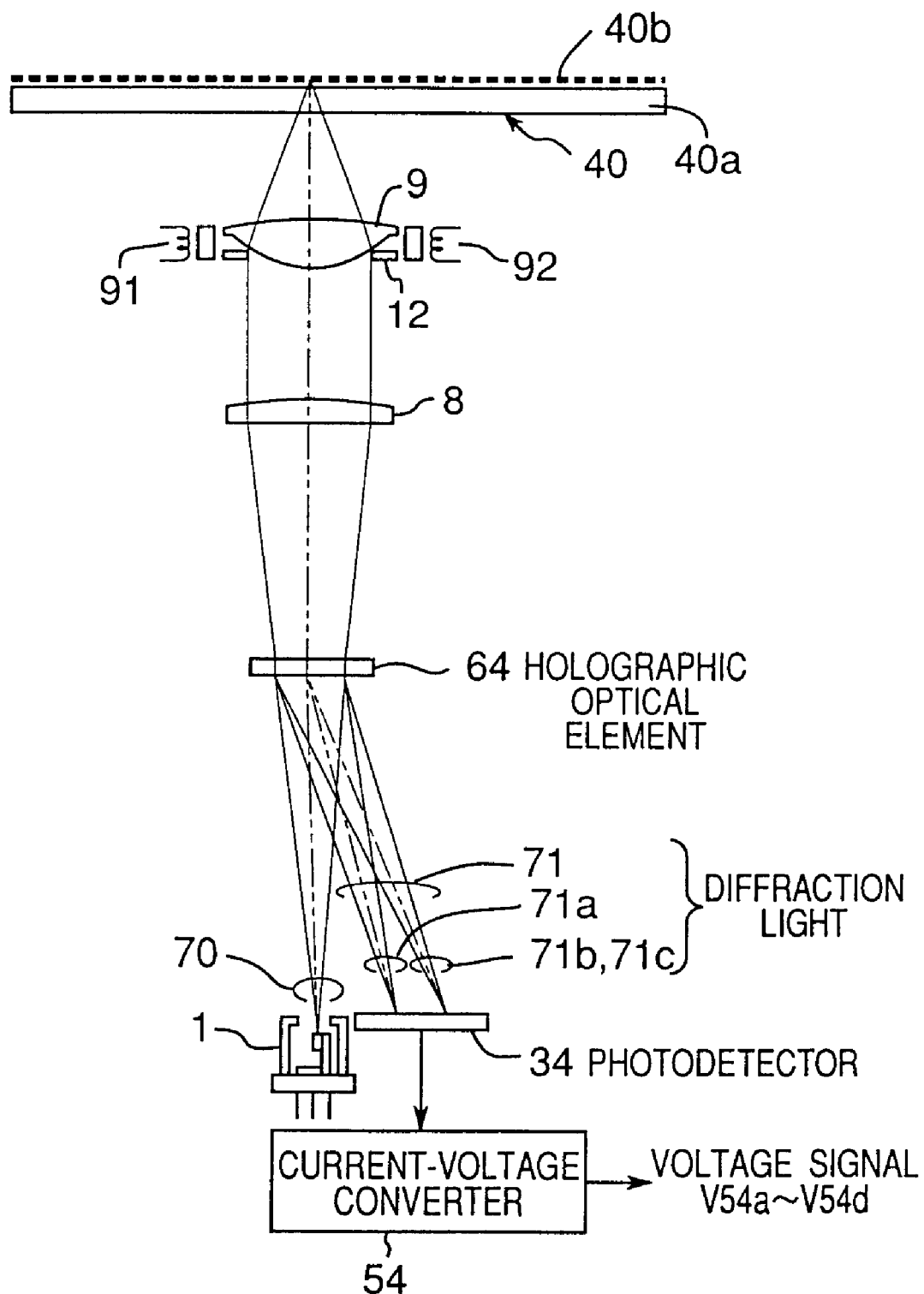
FIG. 3 is a schematic view of an optical pickup head apparatus showing the second embodiment of the present invention.
Figure 5:
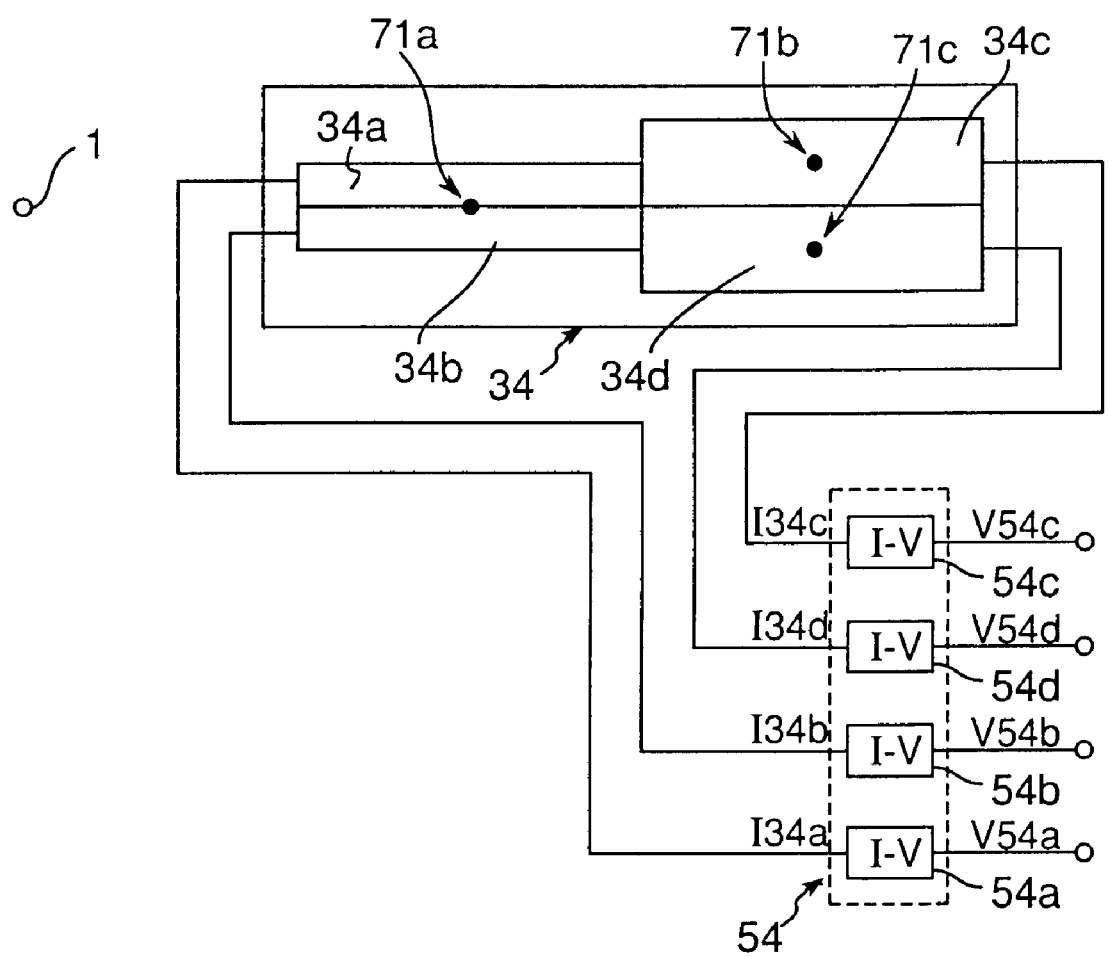
FIG. 5 is a diagram showing the positional relationship between diffraction light and a photodetector in the second embodiment of the present invention.

FIG. 3 is a schematic view of another embodiment of the optical pickup head apparatus of the present invention. The difference between this embodiment and the first embodiment 1 is that the half-mirror 7, the photo detector 31 and the current-to-voltage converting circuit 51 are replaced with a holographic optical element 64, another photo detector 34, and another current-to-voltage converting circuit 54, respectively. The connection between the photo detector 34 and the current-to-voltage converting circuit 54 is illustrated in FIG. 5. Using the holographic optical element 64 as a beam splitter can locate the photo detector 34 adjacent to the light source 1, and hence decreasing the overall dimensions of the optical pickup head apparatus.

Figure 4:
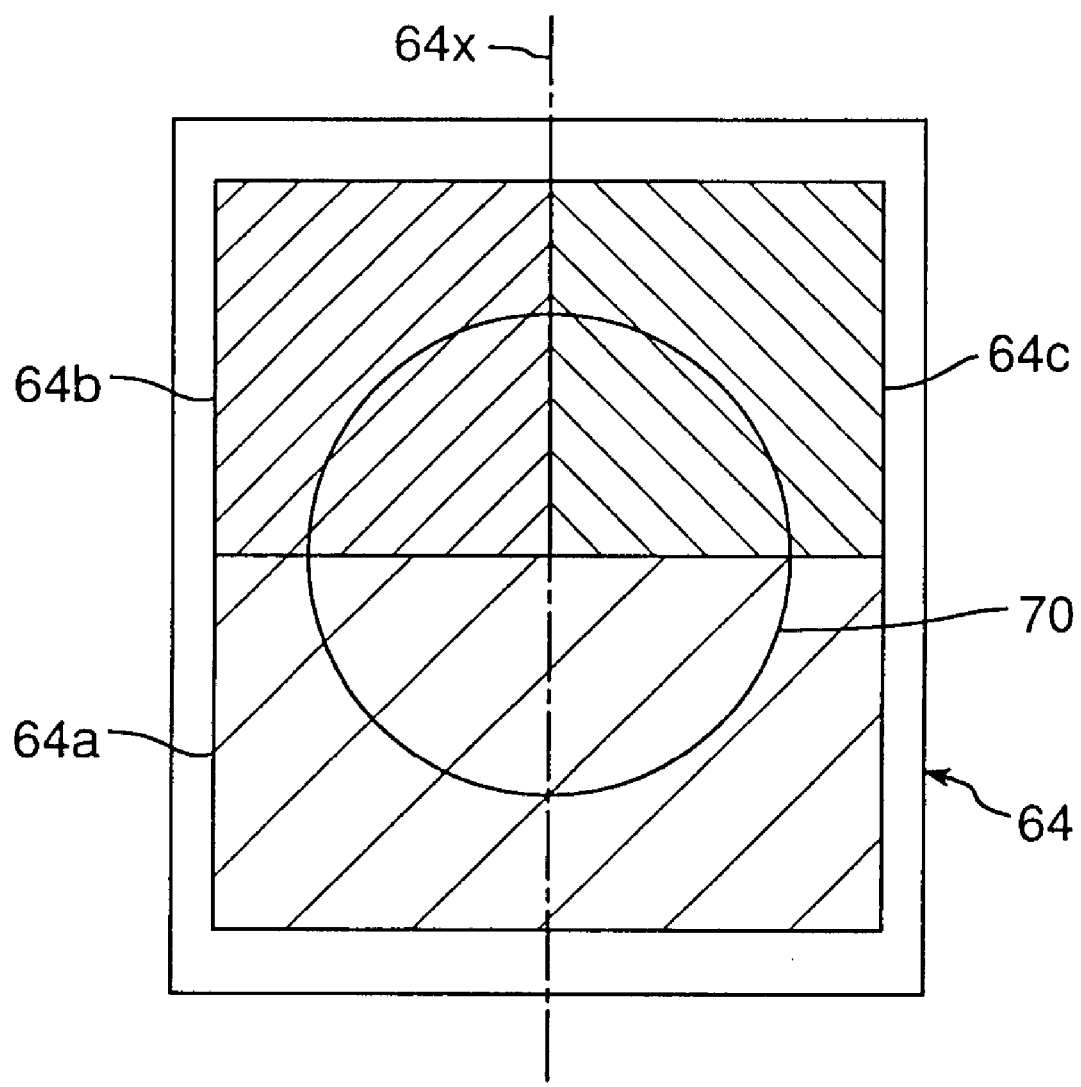
FIG. 4 is a schematic view showing a holographic optical element in the optical pickup head apparatus of the second embodiment of the present invention.

The beam 70 reflected on the data recording surface 40b of a recording medium 40 passes through an objective lens 9 and a collimate lens 8, and goes into the holographic optical element 64 which is a beam splitter. The beam 70 incident to the holographic optical element 64 is converted into diffraction light 71 and received by the photo detector 34. As shown in FIG. 4, the holographic optical element 64 acting as a diffraction element has three receiving areas 64a to 64c which produce from the received beam 70 three different diffraction lights 71a, 71b and 71c, respectively. The three diffraction lights 71a, 71b and 71c composes the diffraction light 71. An axis 64x is disposed so that the axis 64c extends in parallel with a separation line between the two receiving areas 64b and 64c and parallel with the image of a track provided on the data recording surface 40b.

The photo detector 34, as shown in FIG. 5, has four photo receivers 34a to 34d each releasing four current signals I34a to I34d corresponding to amount of received light, respectively. A size of photo receiver 34a or 34b is 50 $\mu$m×200 $\mu$m, while a size of the photo receivers 34c or 34d is 100 $\mu$m×200 $\mu$m. The photo receivers 34a to 34d are enlarged along a line extending between the light source 1 and the diffraction light 71a (in the direction of spatial frequency axis of the pattern 64a of the holographic optical element 64), and four to eight times greater in a size than the photo receivers 31a to 31d of the first embodiment. This is because the diffraction light 71 from the holographic optical element 64 to fall within the photo receivers 34a to 34d, even if the wavelength of the light source 1 is fluctuated or the distance between the light source 1 and the holographic optical element 64 is changed during the assembling of the optical pickup head apparatus. As the capacitance of the photo receiver is approximately proportional to the photo receiver size, the capacitance of the photo receiver 31a, 31b, 31c or 31d is four to eight times greater than that of the photo receiver 31a, 31b, 31c or 31d.

The current signals I34a to I34d from the respective photo receivers 34a to 34d are transferred to corresponding circuits 54a to 54d in the current-to-voltage converting circuit 54, converted into voltage signals V54a to V54d, and then output from the optical pickup head apparatus. A focusing error signal is calculated by a well known Foucault method, that is, by a calculation (V54a−V54b). A tracking error signal is calculated by a phase difference method in which the phases of V54a and V54d are compared when the recording medium is a DVD-ROM or by a push-pull method when the recording medium is a DVD-RAM as expressed by (V54d−V54c). For detecting the tracking error signal, a half of the beam 70 which is a far-field pattern, that is, only the two diffraction lights 71b and 71c is used. In this case, the tracking signal can be obtained as well as the case of use of the full far-field pattern.

Figure 6:
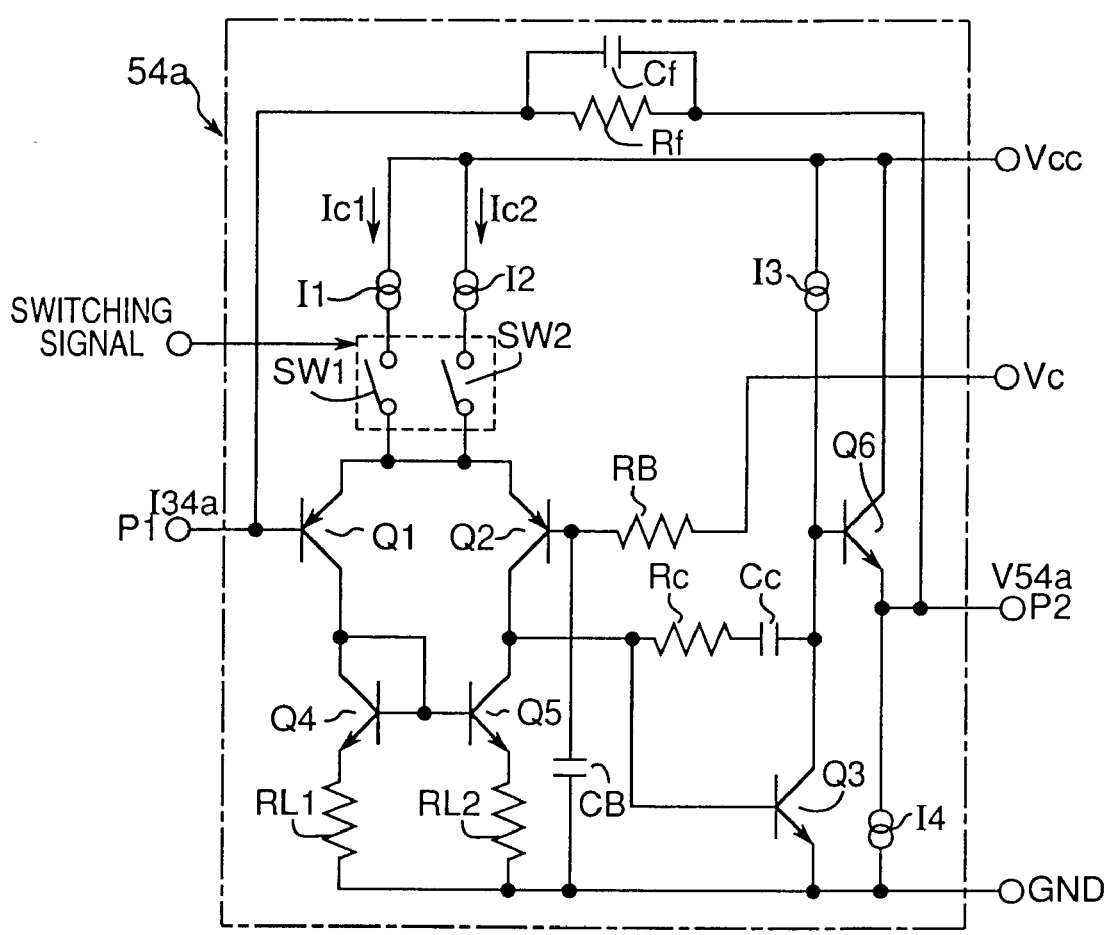
FIG. 6 is a diagram showing a current-to-voltage converting circuit in the optical pickup head apparatus of the second embodiment of the present invention.

FIG. 6 illustrates an arrangement of the circuit 54a in the current-to-voltage converting circuit 54. The circuits 54a to 54d are identical in the arrangement and the circuit 54a will representatively be explained.

The current signal I34a from the photo receiver 34a is fed into a terminal P1. The fed current signal is then converted into a voltage signal by a differential amplifier comprising transistors Q1 and Q2. The voltage at the collector of the transistor Q2 is further amplified by a voltage amplifier comprising a transistor Q3 and a current source load I3, passed through an emitter follower comprising a transistor Q6 and a current source load I4, and released as V54a using the reference voltage Vc from a terminal P2. The voltage signal from the emitter follower is also returned back via a resistor Rf to the base of the transistor Q1 for negative feedback. The degree of the conversion of the current signal to the voltage signal does not depend on the amplification factor of each transistor but is determined by the resistor Rf. While the circuit 51a in the first embodiment is one stage of amplifier including the differential amplifier comprising the two transistors Q1 and Q2, the circuit 54a in this embodiment includes two stages of amplifiers implemented by the differential amplifier comprising the transistors Q1 and Q2 and the voltage amplifier comprising the transistor Q3. Thus, the idling current flowing through the transistors Q1 and Q2 can be decreased, and the current-to-voltage converting circuit 54 can be highly improved in the frequency response.

The current-to-voltage converting circuit 54 can thus consume a minimum current for providing the same level of frequency response. More specifically, when the capacitance is equal to the feedback resistance in the photodetector connected to the current-to-voltage converting circuit, the idling current can be decreased to about a third of that of the current-to-voltage converting circuit 51 as shown in the first embodiment. As a result, consumption power of an optical pickup head apparatus using the current-to-voltage converting circuit 54 of this embodiment can be reduced, and be effective particularly in a data recording or reproducing apparatus which is powered by a battery, for example, portable-use.

Also, the larger the reception area of the current-to-voltage converting circuit 54, the more the circuit 54 becomes effective. The circuit 54a including two stages of amplification may create oscillation at a higher frequency. For avoiding such oscillation, the resistor Rc and the capacitor Cc are provided for phase compensation. If constants of the phase compensation circuit (resistance Rc and capacitance Cc) are determined so that the circuit 54 does not oscillate when the idling current is Ic1, the circuit 54 does not oscillate with the idling current to be Ic2 and can operate stably. This is because with the idling current to be Ic2 the gain crossover frequency of a closed loop in the current-to-voltage converting circuit 54 is reduced to retain a phase margin. By determining constants of the phase compensation circuit as above described, it does not need to change the constants of the phase compensation circuit even though the idling current flowing through the current-to-voltage converting circuit 54 is changed.

Although the transistors Q1 and Q2 are of a PNP type which has generally lower frequency response than an NPN type, a size of emitter of transistor Q1 or Q2 is four times greater than an emitter size of the transistor Q3. This will decrease noise generated by the base resistance of the transistors Q1 and Q2. To reduce noise by increasing the emitter size of the transistor Q1 or Q2 may be more effective as the idling current is more.

In the current-to-voltage converting circuit 54 of this embodiment, the differential amplifier comprising the two transistors Q1 and Q2 has a cascade connection through the transistors Q3 and Q4. This can defuse the capacitance between a collector and a base in the transistors Q1 and Q2. Accordingly, in spite of increasing the transistors Q1 and Q2 in the emitter size, the frequency response will hardly decline.

In the current-to-voltage converting circuit 54A, switches SW1 and SW2 are also provided for switching the connection of the differential amplifier to either of the current source I1 or I2. The switch SW1 is closed when using the recording medium having a high reflectance. The switch SW2 is closed when using the recording medium having a low reflectance. The idling currents Ic1 and Ic2 from the current sources I1 and I2 are 1000 $\mu$A and 100 $\mu$A, respectively. The current Ic2 from the current source I2 is smaller than the current Ic1 from the current source I1. This allows the idling current to be decreased even if the capacitance of each of photo receivers 34a to 34d is greater than that of each of photo receivers 31a to 31d.

Figure 7A:
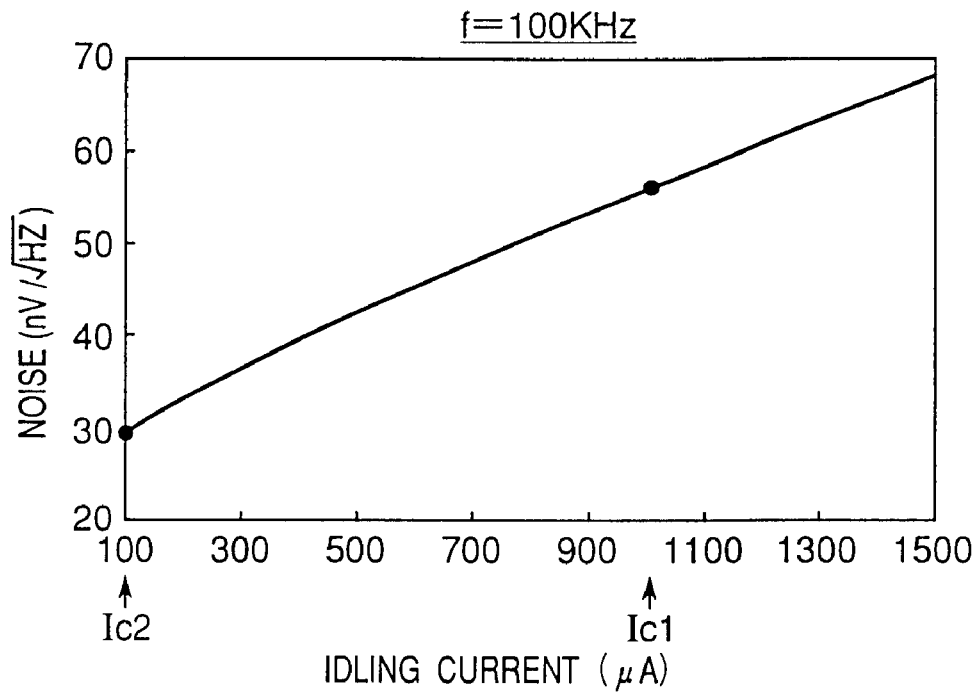
FIG. 7A is a graphic diagram showing the output noise at 100 kHz of frequency in the current-to-voltage converting circuit of the second embodiment of the present invention.
Figure 7B:
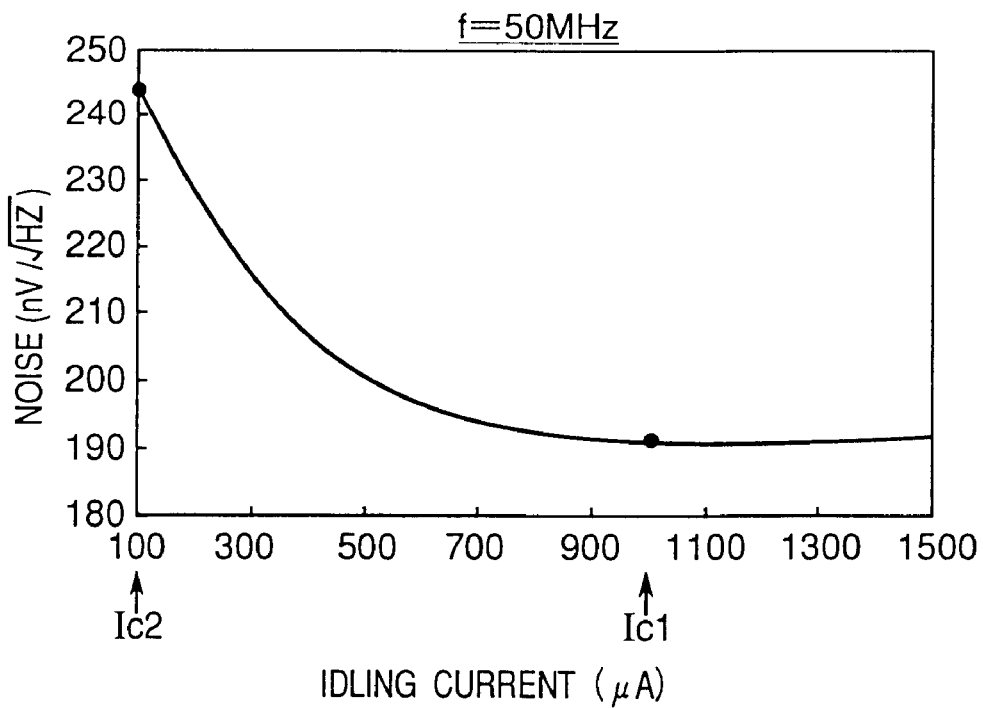
FIG. 7B is a graphic diagram showing the output noise at 50 MHz of frequency in the current-to-voltage converting circuit of the second embodiment of the present invention.

FIGS. 7A and 7B are diagrams showing the relationship between the idling current and the noise released from the terminal P2. FIGS. 7A and 7B illustrate two examples of the noise at 100 kHz and 50 MHz of the frequency respectively. The total capacitance of the photo receiver and wire which are connected to the terminal P1 is set to 4 pF, and the feedback resistance Rf is set to 40 k$\Omega$. As shown in FIG. 7A, the noise at 100 kHz is significantly reduced from 57 nV to 30 nV per root Hz when the idling current is decreased from Ic1 to Ic2 or from 1000 $\mu$A to 100 $\mu$A. On the other hand, when the idling current is decreased from Ic1 to Ic2 or from 1000 $\mu$A to 100 $\mu$A, the noise at 50 MHz is increased from 192 nV to 245 nV per root Hz, as shown in FIG. 7B.

Accordingly, when the recording medium having a low reflectance as 15% such as a DVD-RAM is used, the use of the idling current Ic2 can significantly reduce the noise at around a frequency of 100 kHz and thus improve the signal-to-noise ratio, contributing to the reading of data at high accuracy from the recording medium at a one to four times great speed. When the recording medium having a high reflectance as 70% such as a DVD-ROM is used, the use of the idling current Ic1 can favorably reduce the noise at around 50 MHz and thus improve the signal-to-noise ratio in a broad band. Simultaneously, the reading of data from the recording medium can accurately be carried out at a 100 times or more great speed.

In this embodiment (See FIG. 6), the output of the voltage amplifier comprising the transistor Q3 and the current source I3 is retrieved through the emitter follower by the transistor Q6 and the current source I4. However the other means which is generally known in the operational amplifier such as a push-pull amplifier may be utilized instead of the emitter follower. The emitter follower is most appropriate for an application required for a high speed, because frequency characteristic can be extended most when an output stage comprises the emitter follower. Further it may be appropriate to compact the apparatus since circuit size can be reduced most. Also it may be appropriate to reduce consumption power since a slew rate can be increased with a few current.

Also the photo detector and the light source may be united, thus further reducing the overall size of the optical pickup head apparatus. When the photo detector and the current-to-voltage converting circuit are fabricated on the same semiconductor substrate, the capacitance developed in wires between the photo detector and the current-to-voltage converting circuit can be minimized, hence declining a operation current of the current-to-voltage converting circuit, improving the high-speed operation, and reducing the noise at around 50 MHz.

Moreover, the current-to-voltage converting circuit of this embodiment can be applied with any detecting techniques such as a spot size detecting method for determining the focusing error signal and a three-beam method for determining the tracking error signal, and is hardly limited by any construction of the optical system. The photo receiver may be provided for receiving conjugate components of the diffraction light 71 from the holographic optical element. This increases the efficiency of the use of light to two times greater, thus providing the optical pickup head apparatus having a high signal-to-noise ratio.

(Third Embodiment)

Figure 8:
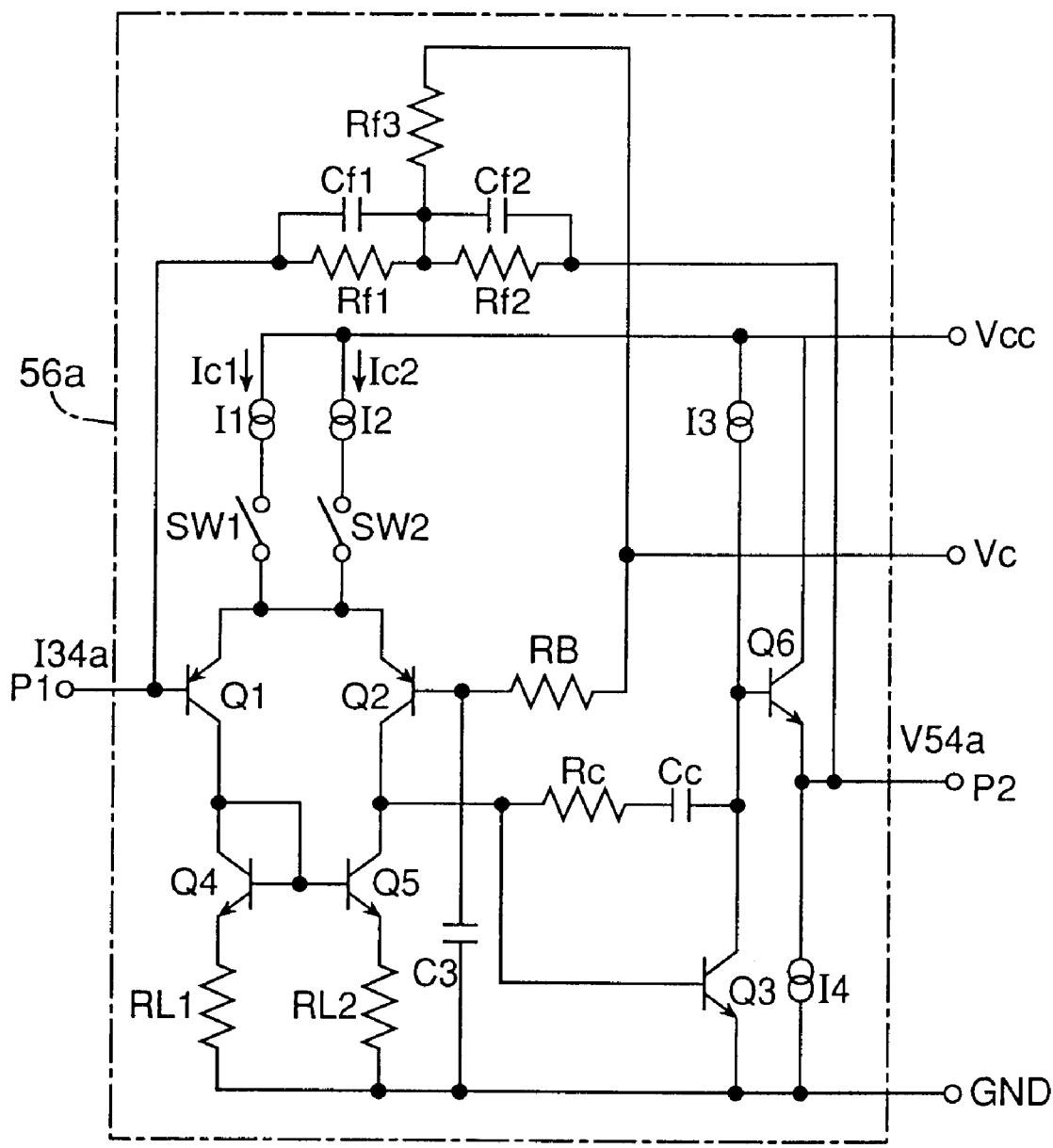
FIG. 8 is a diagram of a current-to-voltage converting circuit in an optical pickup head apparatus in the third embodiment of the present invention.

FIG. 8 is a schematic diagram of a further embodiment of the current-to-voltage converting circuit according to the present invention. A circuit 56a in the current-to-voltage converting circuit of this embodiment corresponds to, for example, circuits 54a to 54d composing the current-to-voltage converting circuit of the second embodiment. The difference between the circuit 56a and 54a is that the feedback resistor comprises one resistor Rf in the circuit 54a while the feedback resistor comprises three resistors Rf1 to Rf3 in the circuit 56a. Capacitors Cf1 and Cf2 are provided for phase compensation. An equivalent feed back resistor Rfe of the circuit 56a is obtained by Rfe=Rf1+Rf2+(Rf1× Rf2)/Rf3. When Rf1=Rf2=10 kΩ and Rf3=2 kΩ, Rfe becomes 70 kΩ. That is, a large feedback resistance can be equivalently obtained by small resistances. There is a problem that when a large feedback resistance is needed and the feedback resistor is composed of only one resistor to prevent parasitic capacitance of the resistor from increasing, it is difficult to satisfy both of a frequency characteristic to be required and a feedback resistance because of a constraint of a cutoff frequency defined by the feedback resistance and the parasitic capacitance. The current-to voltage converting circuit of this embodiment is very effective to such an problem. To maximize the equivalent feedback resistance in a certain finite resistance range, it is sufficient to equalize Rf1 with Rf2. To reduce the noise as much as possible, it is sufficient to increase value of Rf1+Rf2 as much as possible and to set Rf1 to be larger than Rf2. The smaller Rf2 is than Rf1, the smaller the noise.

(Fourth Embodiment)

Figure 9:
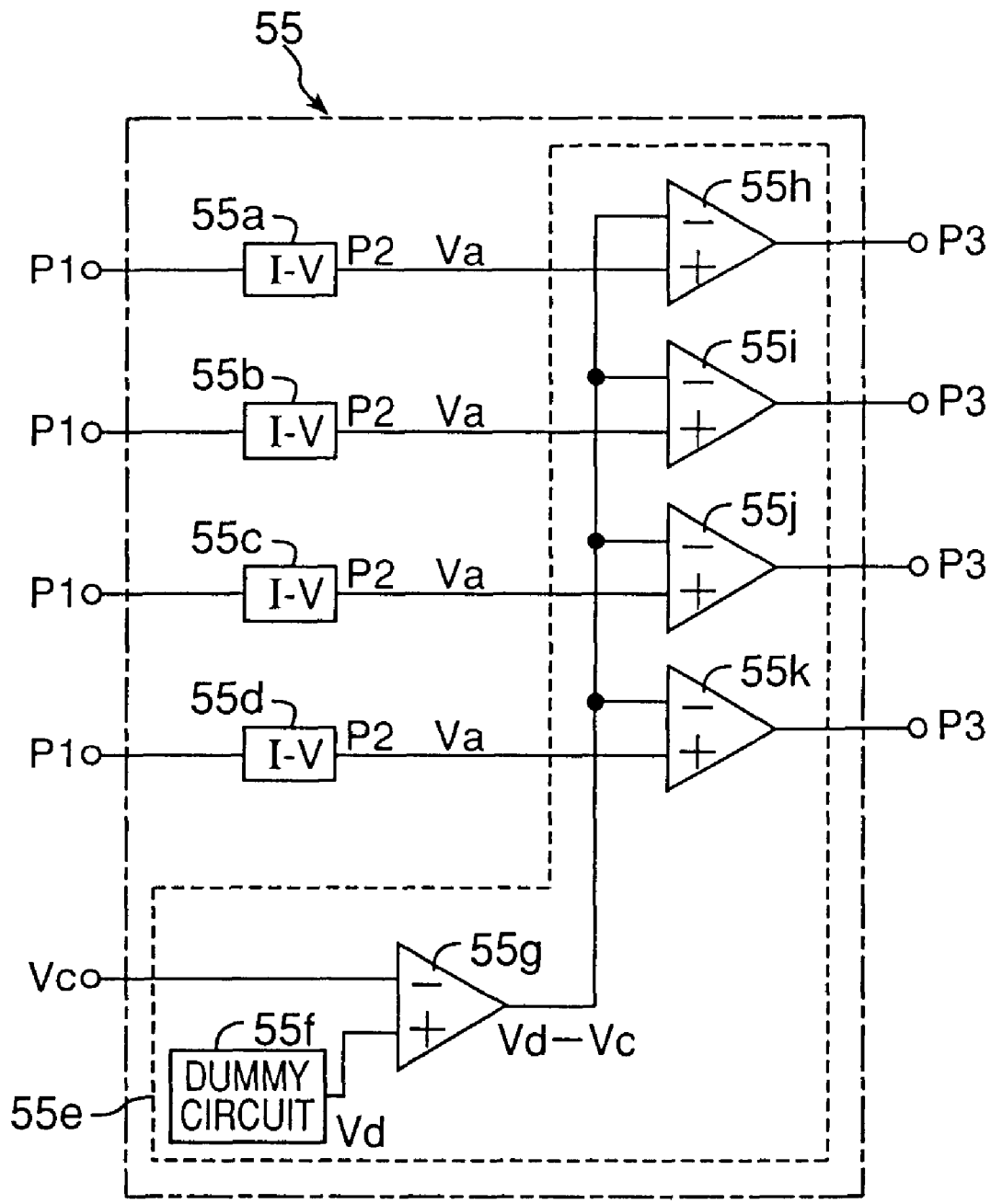
FIG. 9 is a diagram of a current-to-voltage converting circuit in an optical pickup head apparatus in the fourth embodiment of the present invention.

FIG. 9 is a schematic diagram of a further embodiment of the current-to-voltage converting circuit according to the present invention. An optical pickup head apparatus according to this embodiment uses a novel current-to-voltage converting circuit 55 which is different from the current-to-voltage converting circuit 51 of the first embodiment.

Figure 10:
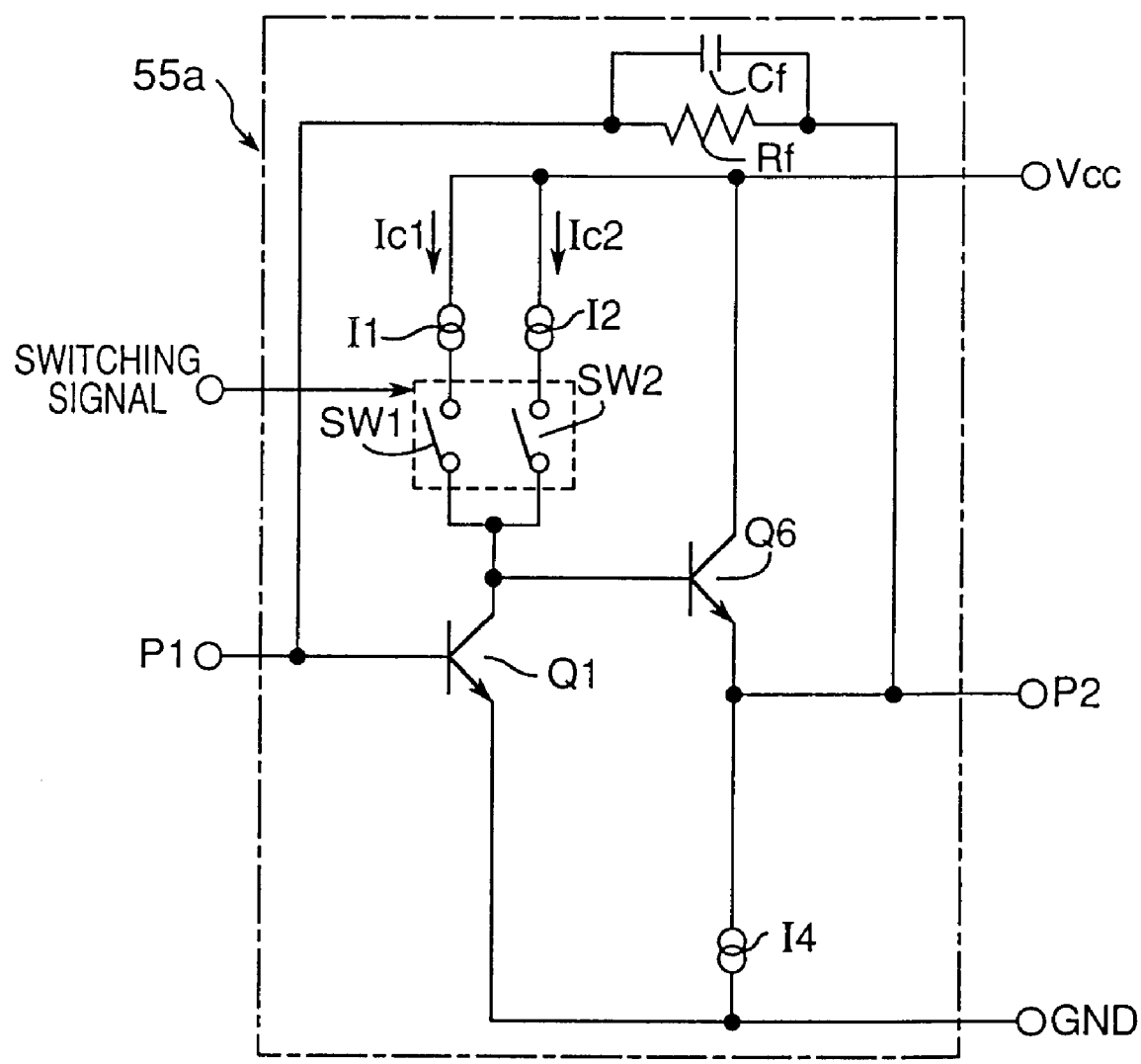
FIG. 10 is a diagram showing a circuitry arrangement in the current-to-voltage converting circuit of the fourth embodiment of the present invention.

FIG. 10 illustrates a circuit 55a in the current-to-voltage converting circuit 55 of this embodiment. The circuits 55a to 55d are identical in the arrangement each other, and the circuit 55a will representatively be illustrated for explaining the action.

The current signal from a photo receiver 31a is fed into a terminal P1. The fed current signal is converted into a voltage signal by a grounded emitter amplifier comprising a transistor Q1. The idling signals Ic1 and Ic2 are selectively used depending on the type of the recording medium. The current sources I1 and I2 serve as a load of the grounded emitter amplifier. The voltage at the collector of the transistor Q1 is passed through an emitter follower comprising a transistor Q6 and a current source load I4, and released from a terminal P2. The voltage signal through the emitter follower is also returned back via a resistor Rf to the base of the transistor Q1 for negative feedback. Since the circuit 55a different from the circuit 51a is a differential amplifier, the circuit 55a does not include the resistor RB and the transistor Q2, thus ensuring an operation with lower noises than the circuit 51a. The optical pickup head apparatus using the current-to-voltage converting circuit 55 of this embodiment is higher in the signal-to-noise ratio hence allowing the data stored in the recording medium to be read at a higher reliability.

However, since the circuit 55a in the current-to-voltage converting circuit 55 is not a differential amplifier 4, it does not act with the reference voltage Vc and the signal output from the terminal P2 includes a great direct current (DC) offset. Such a DC offset may be corrected by an offset compensator 55e shown in FIG. 8. The offset compensator 55e comprises a dummy circuit 55f, a differential operating circuit 55a, and four operation circuits 55h to 55k. The dummy circuit 55f is substantially identical to the circuit 55a in a structure, and an idling current of the circuit 55f is switched at the same time when the idling current on the circuit 55a is switched.

The dummy circuit 55f is connected with no photo receiver. The differential operating circuit 55g is connected at its positive input with a direct current voltage Vd from the dummy circuit 55f and at its negative input with the reference voltage Vc. Accordingly, the output of the differential operating circuit 55g is expressed by Vd-Vc. Each of the four calculators 55h to 55k receives an output from corresponding one of the circuits 55a to 55d at its positive input, and an output from the differential operating circuit 55g at its negative input to implement a differential operation. The direct current voltage output is assumed to be Va when the circuits 55a to 55d receive no signal. Then, the DC output of the operating circuits 55h to 55k becomes Va−(Vd−Vc). As the circuit 55a is identical to the dummy circuit 55f, Va is equal to Vd and hence DC voltage output from the operating circuit 55h becomes Vc. The Vc is the reference voltage. The output of the current-to-voltage converting circuit 55 is then passed through the operating circuits 55h to 55k and released from a terminal P3.

In the above description, the differential operation is implemented. However, an adding operation may be implemented depending on a polarity of signal output from the circuits 55a to 55d. This may depend on the design and wiring of the circuit.

Although in this embodiment, the optical pickup head apparatus and the optical data reproducing method are explained in which the idling current is switched between Ic1 and Ic2, using DVD-ROM and DVD-RAM as an example, the current-to-voltage converting circuit of this embodiment is not limited to the DVD recording media. The current-to-voltage converting circuit may be applied to an optical pickup head apparatus which is operable to two kinds of recording media each having different reflectance, or one kind of recording medium having two kinds of reproduction rates. Also, the current-to-voltage converting circuit of this embodiment can be applied not only to a recording medium, but also to an optical communications system in which a plurality of light sources are provided and amount of light received by the photodetector is varied depending on the condition of the light source or the medium, for example, the photodetector receives a several amounts of lights.

(Fifth Embodiment)

Figure 11:
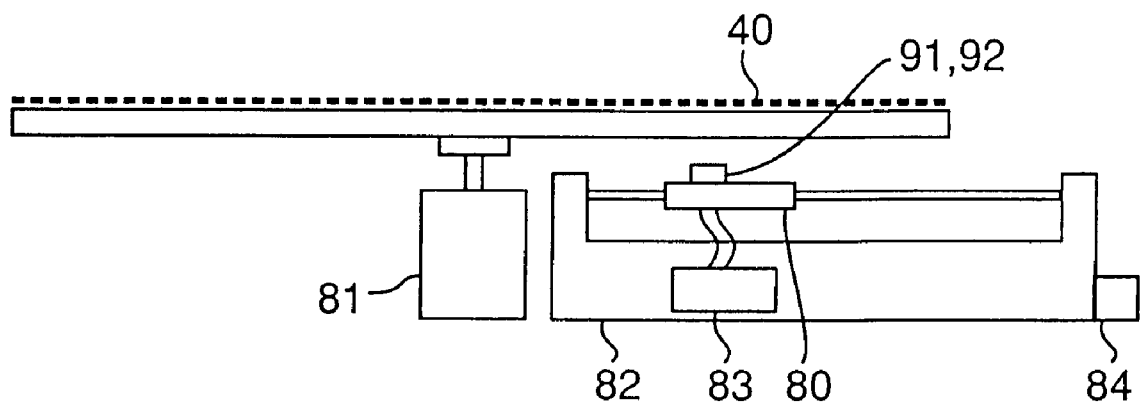
FIG. 11 is a schematic view of a data recording/reproducing apparatus in the fourth embodiment of the present invention.
Figure 12:
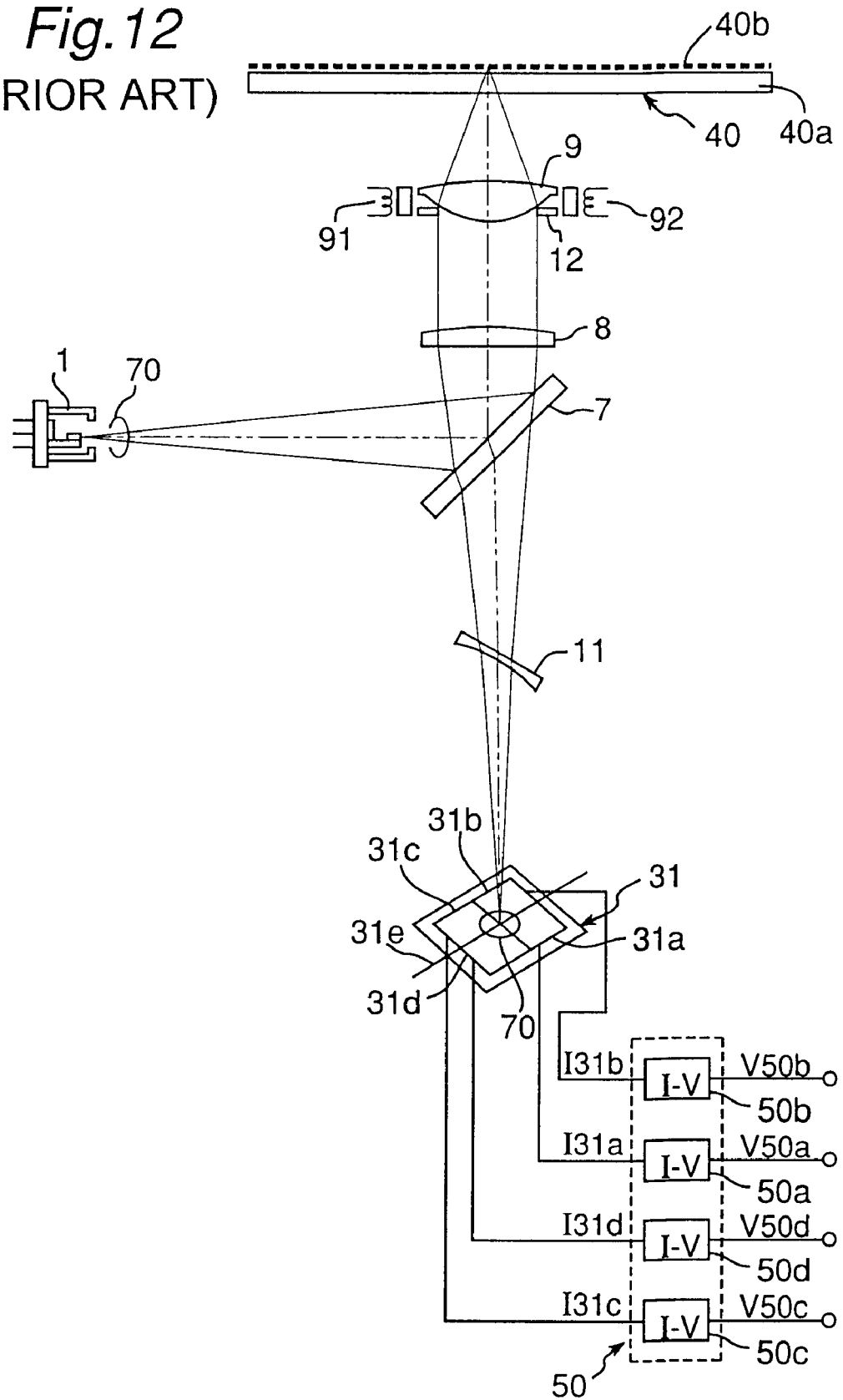
FIG. 12 is a schematic view of a conventional optical pickup head apparatus.
Figure 13:
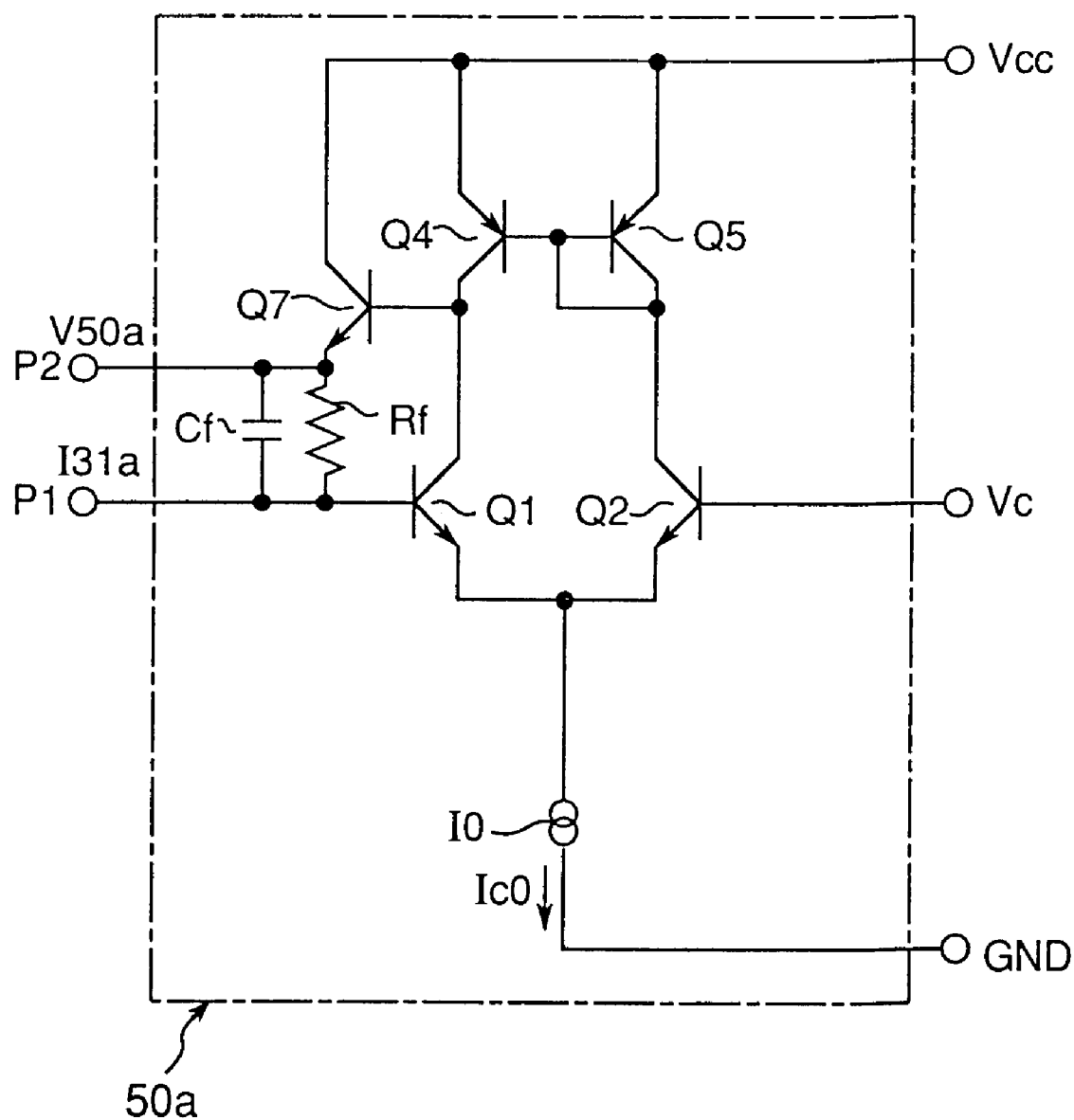
FIG. 13 is a diagram showing a current-to-voltage converting circuit in the conventional optical pickup head apparatus.

FIG. 11 illustrates an apparatus for recording or reproducing data which employs one of the optical pickup head apparatuses described previously. The apparatus comprises an optical pickup head apparatus 80, an optical recording medium drive 81, an optical pickup head drive 82, an electric circuit 83, and a power supply 84. The optical recording medium drive 81 rotates a recording medium 40.

The optical pickup head apparatus 80 supplies the electric circuit 83 with a signal indicating the positional relationship between the optical pickup head apparatus 80 and the recording medium 40. The electric circuit 83 carries out amplification or arithmetic operation to the signal to position the optical pickup head apparatus 80 or an objective lens in the optical pickup head apparatus 80. The optical pickup head apparatus 80 also supplies the electric circuit 83 with a data signal carrying data read out from the recording medium 40. The electric circuit 83 decodes the data stored in the recording medium 40. Actuators 91 and 92 drive the objective lens in the optical pickup head apparatus 80. The signal and drive 82 or the actuators 91 and 92 in the optical pickup head apparatus 80 perform a focus servo action and a tracking servo action on the recording medium 40 for writing, reading or erasing data. The power supply 84 or a connection to an external power supply provides, with power, the electric circuit 83, the optical pickup head drive 82, the optical recording medium drive 81, and the actuators 91 and 92. The power supply or connection terminals to the external power supply may be provided for each drive circuit.

As described above, the invention provides the apparatus which has high reliability, is manufactured with low cost, can perform stable reproduction operation independent on the type of the medium in case that the recording media each having different optical characteristic. For example, the invention provides the apparatus which can perform stably both of reading data at high speed from the recording medium such as DVD-ROM, and reading surely data with a low signal level from the recording medium such as DVD-RAM.

Although the present invention has been described in connection with specified embodiments thereof, many other modifications, corrections and applications are apparent to those skilled in the art. Therefore, the present invention is not limited by the disclosure provided herein but limited only to the scope of the appended claims.

What is claimed is:

1. A current-to-voltage converting circuit which receives a current signal output from a photodetector outputting a current signal according to amount of received light and converts the received current signal into a voltage signal, comprising:
    an active element applied with a negative feedback; and
    a variable current section for varying an idling current which is to be supplied to the active element in accordance with a level of the current signal received from the photodetector or a reproduction speed of the data.

2. The current-to-voltage converting circuit according to claim 1, wherein the active element is a differential amplifier.

3. The current-to-voltage converting circuit according to claim 1, being formed on the same semiconductor substrate as a semiconductor substrate on which the photodetector is formed.

4. An optical pickup head apparatus comprising:
    a light source for emitting a laser beam;
    a light focusing section for focusing the beam which is received from the light source on a recording medium;
    a beam splitter for splitting the beam which is reflected on the recording medium;
    a photodetector for receiving the split beam from the beam splitter and releasing a current signal which corresponds to amount of the received beam; and
    the current-to-voltage converting circuit according to claim 1 for converting the current signal received from the photodetector into a voltage signal.

5. The optical pickup head apparatus according to claim 4, wherein the beam splitter is a diffraction element.

6. A apparatus for recording or reproducing data comprising:
    the optical pickup head apparatus defined according to claim 4;
    a drive for varying the relative position of the optical pickup head apparatus to a recording medium; and
    a signal processor for applying a predetermined operation to a signal received from the optical pickup head apparatus to provide a desired data.

7. A current-to-voltage converting circuit comprising:
    a current-to-voltage converter which receives a current signal output from a photodetector outputting a current signal according to amount of received light and converts the received current signal into a voltage signal, the current-to-voltage converter comprising an active element applied with a negative feedback;
    a dummy circuit which has the same structure as the current-to-voltage converter and receives no current signal from the photodetector; p1 a differential operator for performing a differential operation between a signal output from the dummy circuit and a reference signal;
    a operating section for performing a differential operation or an adding operation, using the voltage signal from the current-to-voltage converter and a signal output from the differential operator; and
    a current variable section for varying an idling current which is to be supplied to the active element in accordance with a level of the current signal received from the photodetector or a reproduction speed of the data.

8. The current-to-voltage converting circuit according to claim 7, wherein the active element is a differential amplifier.

9. The current-to-voltage converting circuit according to claim 7, being formed on the same semiconductor substrate as a semiconductor substrate on which the photodetector is formed.

10. An optical pickup head apparatus comprising:
    a light source for emitting a laser beam;
    a light focusing section for focusing the beam which is received from the light source on a recording medium;
    a beam splitter for splitting the beam which is reflected on the recording medium;
    a photodetector for receiving the split beam from the beam splitter and releasing a current signal which corresponds to amount of the received beam; and
    the current-to-voltage converting circuit according to claim 7 for converting the current signal received from the photodetector into a voltage signal.

11. A current-to-voltage converting circuit which receives a current signal output from a photodetector outputting a current signal according to amount of received light and converts the received current signal into a voltage signal, comprising:
    a current-to-voltage converter for converting the current signal into the voltage signal; and
    a variable current section for varying an idling current which is to be supplied to the current-to-voltage converter in accordance with a level of the current signal received from the photodetector or a reproduction speed of the data;

wherein a gain to convert a current into a voltage is provided by a negative feedback in which a signal output from the current-to-voltage converter is negatively fed back into an input of the current-to-voltage converter.

12. The current-to-voltage converting circuit according to claim 11 wherein the active element is a differential amplifier.

13. The current-to-voltage converting circuit according to claim 11, being formed on the same semiconductor substrate as a semiconductor substrate on which the photodetector is formed.

14. An optical pickup head apparatus comprising:
a light source for emitting a laser beam;
a light focusing section for focusing the beam which is received from the light source on a recording medium;
a beam splitter for splitting the beam which is reflected on the recording medium;
a photodetector for receiving the split beam from the beam splitter and releasing a current signal which corresponds to amount of the received beam; and
the current-to-voltage converting circuit according to claim 11 for converting the current signal received from the photodetector into a voltage signal.

15. A current-to-voltage converting circuit which receives a current signal output from a photodetector outputting a current signal according to amount of received light and converts the received current signal into a voltage signal, comprising:
a current-to-voltage converter for converting the current signal into the voltage signal;
an amplifier for receiving the voltage signal from the current-to-voltage converter and amplifying the received voltage signal; and
a current variable section for varying an idling current which is to be supplied to the current-to-voltage converter in accordance with a level of the current signal received from the photodetector or a reproduction speed of the data,
wherein a gain to convert a current into a voltage is provided by a negative feedback in which a signal output from the amplifier is negatively fed back to the current-to-voltage converter.

16. The current-to-voltage converting circuit according to claim 15, wherein the amplifier comprises a phase compensating section which prevents an oscillation of the circuit, constants of the phase compensating section are determined so that the circuit does not oscillate at the idling current which is maximum, and the constants of the phase compensating section are not changed even though the idling current which is to be supplied to the current-to-voltage converting circuit is changed.

17. The current-to-voltage converting circuit according to claim 15, wherein the active element is a differential amplifier.

18. The current-to-voltage converting circuit according to claim 15, being formed on the same semiconductor substrate as a semiconductor substrate on which the photodetector is formed.

19. An optical pickup head apparatus comprising:
a light source for emitting a laser beam;
a light focusing section for focusing the beam which is received from the light source on a recording medium;
a beam splitter for splitting the beam which is reflected on the recording medium;
a photodetector for receiving the split beam from the beam splitter and releasing a current signal which corresponds to amount of the received beam; and
the current-to-voltage converting circuit according to claim 15 for converting the current signal received from the photodetector into a voltage signal.

20. A method of reproducing data from a recording medium by using a current-to-voltage converting circuit for converting a current signal from a photodetector to a voltage signal, the photodetector providing the current signal corresponding to amount of the light reflected on the recording medium, the current-to-voltage converting circuit including an active element applied with a negative feedback and being operable to vary an idling current to be supplied to the active element,
wherein the current signal provided from the photodetector has two different levels including a first level and a second level which is smaller than the first level, the idling current to be supplied to the active element has two different currents including a first current and a second current which is smaller than the first current,
the method comprising:
detecting the level of the current signal provided from the photodetector; and
setting the detected idling current to the first current when the current signal from the photodetector is at the first level, or setting the detected idling current to the second current when the current signal from the photodetector is at the second level.

21. A method of reproducing data from a recording medium by using a current-to-voltage converting circuit for converting a current signal from a photodetector to a voltage signal, the photodetector providing the current signal corresponding to amount of the light reflected on the recording medium, the current-to-voltage converting circuit including an active element applied with a negative feedback and being operable to vary an idling current to be supplied to the active element,
wherein the current signal provided from the photodetector is transferred at one of a first transfer rate and a second transfer rate which is slower than the first transfer rate, the idling current to be supplied to the active element has one of a first current and a second current which is smaller than the first current,
the method comprising:
detecting the transfer rate of the data; and
setting the idling current to the first current when the current signal from the photodetector is transferred at the first transfer rate, or setting the idling current to the second current when the current signal from the photodetector is transferred at the second transfer rate.

* * * * *

UNITED STATES PATENT AND TRADEMARK OFFICE
CERTIFICATE OF CORRECTION

PATENT NO.    : 6,480,042 B2
DATED         : November 12, 2002
INVENTOR(S)   : Shin-ichi Kadowaki It is certified that error appears in the above-identified patent and that said Letters Patent is hereby corrected as shown below:

Column 14,
Line 25, delete "p1" and insert paragraph break before "a".

Column 15,
Line 7, insert -- , -- after "11".

Signed and Sealed this

Twenty-ninth Day of April, 2003

JAMES E. ROGAN
*Director of the United States Patent and Trademark Office*